(12) United States Patent
Li et al.

(10) Patent No.: US 11,417,651 B2
(45) Date of Patent: Aug. 16, 2022

(54) POWER SUPPLIES AND SEMICONDUCTOR APPARATUSES WITH FUNCTIONS OF CURRENT-SAMPLING AND HIGH-VOLTAGE STARTUP

(71) Applicant: Leadtrend Technology Corporation, Zhubei (TW)

(72) Inventors: Jhen Hong Li, Zhubei (TW); Han Wei Chen, Zhubei (TW)

(73) Assignee: LEADTREND TECHNOLOGY CORPORATION, Zhubei (TW)

( * ) Notice: Subject to any disclaimer, the term of this patent is extended or adjusted under 35 U.S.C. 154(b) by 178 days.

(21) Appl. No.: 17/088,674

(22) Filed: Nov. 4, 2020

(65) Prior Publication Data

US 2021/0313318 A1 Oct. 7, 2021

(30) Foreign Application Priority Data

Apr. 7, 2020 (TW) .................................. 109111595

(51) Int. Cl.
| | |
|---|---|
| *H01L 29/808* | (2006.01) |
| *H01L 27/088* | (2006.01) |
| *H01L 29/78* | (2006.01) |
| *H02M 3/335* | (2006.01) |
| *H02M 1/08* | (2006.01) |
| *H02M 1/36* | (2007.01) |
| *H02M 1/00* | (2006.01) |

(52) U.S. Cl.
CPC ...... *H01L 27/0883* (2013.01); *H01L 29/7802* (2013.01); *H01L 29/8083* (2013.01); *H02M 1/08* (2013.01); *H02M 1/36* (2013.01); *H02M 3/33569* (2013.01); *H02M 1/0009* (2021.05)

(58) Field of Classification Search
CPC ............. H01L 27/0883; H01L 29/8083; H01L 29/7802; H02M 3/33569
See application file for complete search history.

(56) References Cited

U.S. PATENT DOCUMENTS

| | | | |
|---|---|---|---|
| 2019/0081039 A1* | 3/2019 | Siemieniec | ........... H01L 29/205 |
| 2019/0096874 A1* | 3/2019 | Rajagopal | ........... H01L 27/0285 |

\* cited by examiner

*Primary Examiner* — Adolf D Berhane
*Assistant Examiner* — Afework S Demisse
(74) *Attorney, Agent, or Firm* — McClure, Qualey & Rodack, LLP

(57) ABSTRACT

A semiconductor apparatus includes first, second and third transistors integrated in a monocrystal chip. Both the first and second transistors are vertical devices, each having a source node, a gate node and a drain node. The source node of the first transistor electrically connects to a primary source pin, the source node of the second transistor to a sample pin, and the gate nodes of the first and the second transistors to a control-gate pin. The third transistor is a vertical JFET with a source node, a control node and a drain node. The source node of the third transistor electrically connects to a charge pin, and the control node of the third transistor to a charge-control pin. All of the drain nodes of the first, second and third transistors are electrically connected to a high-voltage pin.

11 Claims, 4 Drawing Sheets

POWER SUPPLIES AND SEMICONDUCTOR APPARATUSES WITH FUNCTIONS OF CURRENT-SAMPLING AND HIGH-VOLTAGE STARTUP

CROSS-REFERENCE TO RELATED APPLICATION

This application claims priority to and the benefit of Taiwan Application Series Number 109111595 filed on Apr. 7, 2020, which is incorporated by reference in its entirety.

BACKGROUND

The present disclosure relates generally to switching mode power supplies, and, more particularly, to semiconductor apparatuses with current-sampling and high-voltage startup functions applicable in switching mode power supplies.

FIG. 1 demonstrates power supply 100 with a flyback topology, for converting input power source $V_{IN}$ at the primary side into output power source $V_{OUT}$ at the secondary side. Input power source $V_{IN}$ could be as high as 260 volt, generated for example by rectifying an alternating-voltage main power from a wall outlet, and output power source $V_{OUT}$ could be as low as 5 volt for example to supply power to a mobile phone.

Pulse-width-modulation controller 102 controls power switch NS via gate-driving pin GATE, where inductor LP, power switch NS, and current-sense resistor RCS are connected in series between input power source $V_{IN}$ and a ground line. Current-sense pin CS converts the current through power switch NS into a voltage signal, based on which pulse-width-modulation controller 102 generates appropriate pulses to control power switch NS.

Pulse-width-modulation controller 102 could integrate with high-voltage startup apparatus 104 to perform the function of high-voltage startup. High-voltage startup apparatus 104 is electrically connected to input power source $V_{IN}$ via high-voltage pin HV and resistor RHS. For example, when power supply 100 is just connected to a wall outlet to build up input power source $V_{IN}$, high-voltage startup apparatus 104 can drain current from high-voltage pin HV to charge, via operating power pin VCC, capacitor CVCC and build up operating power source $V_{CC}$, which substantially supplies the electric power required by pulse-width-modulation controller 102.

As technology advances, it always haunts the manufactures of power supplies to produce power supplies with higher power conversion efficiency and less production cost.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The invention can be more fully understood by the subsequent detailed description and examples with references made to the accompanying drawings, wherein.

DETAILED DESCRIPTION

According to embodiments of the invention, two enhancement-mode MOSFETs (metal-oxide-semiconductor field effect transistor) and a depletion-mode JFET (junction field effect transistor) are integrated in a monocrystal chip.

One of the two enhancement-mode MOSFETs can be used as a main power switch in a power supply, and the other as a current-sampling switch to sense the current through an inductor. This arrangement of two enhancement-mode MOSFETs could improve power conversion efficiency.

The depletion-mode JFET could act as a high-voltage startup switch, possibly increasing power conversion efficiency. The introduction of depletion-mode JFET could reduce the overall cost of a power supply as well, because a pulse-width-modulation controller of the power supply could be formed on a monocrystal chip manufactured by a relatively-low-voltage process.

Figure 1:
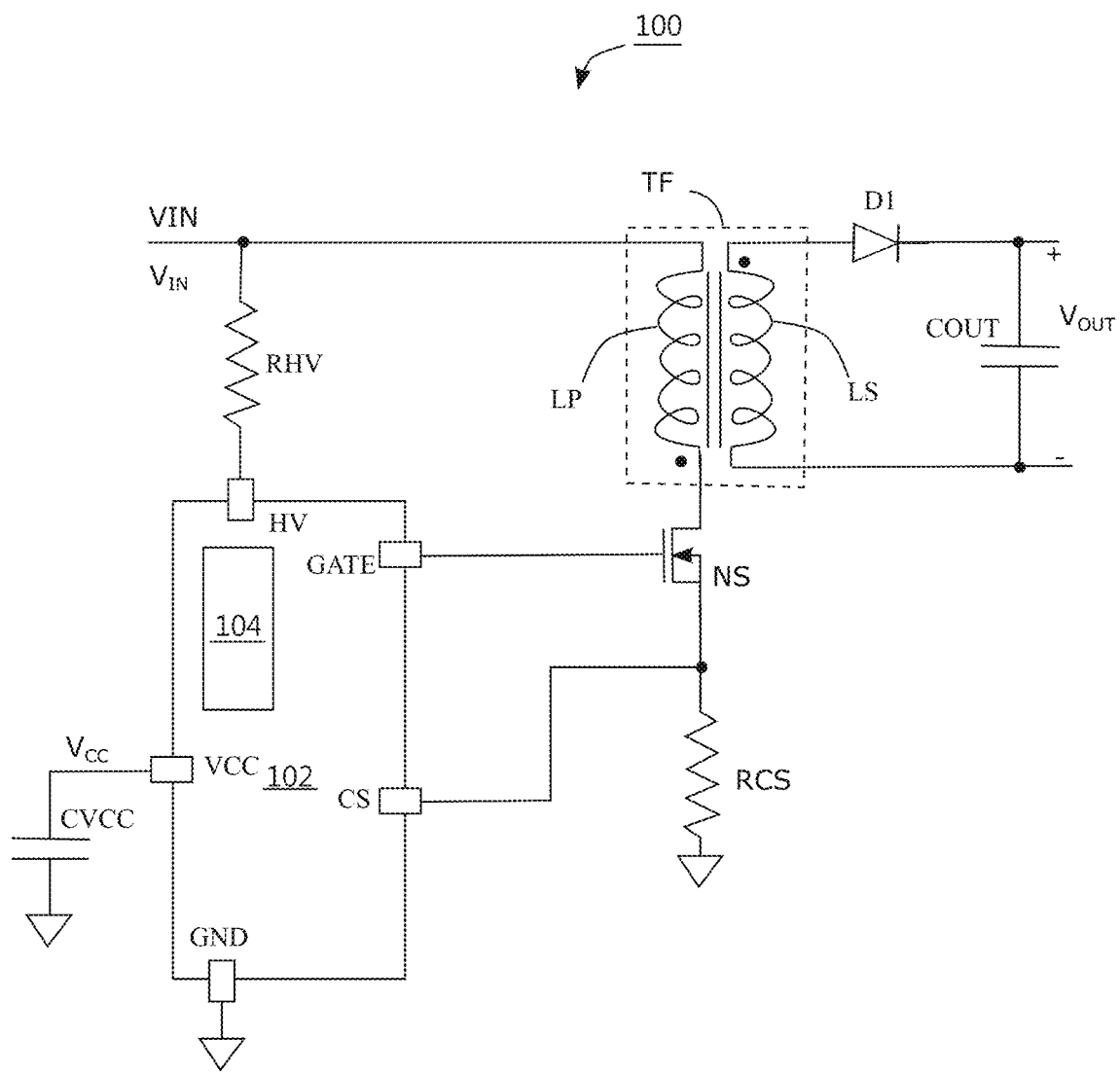
FIG. 1 demonstrates power supply 100 with a flyback topology.
Figure 2:
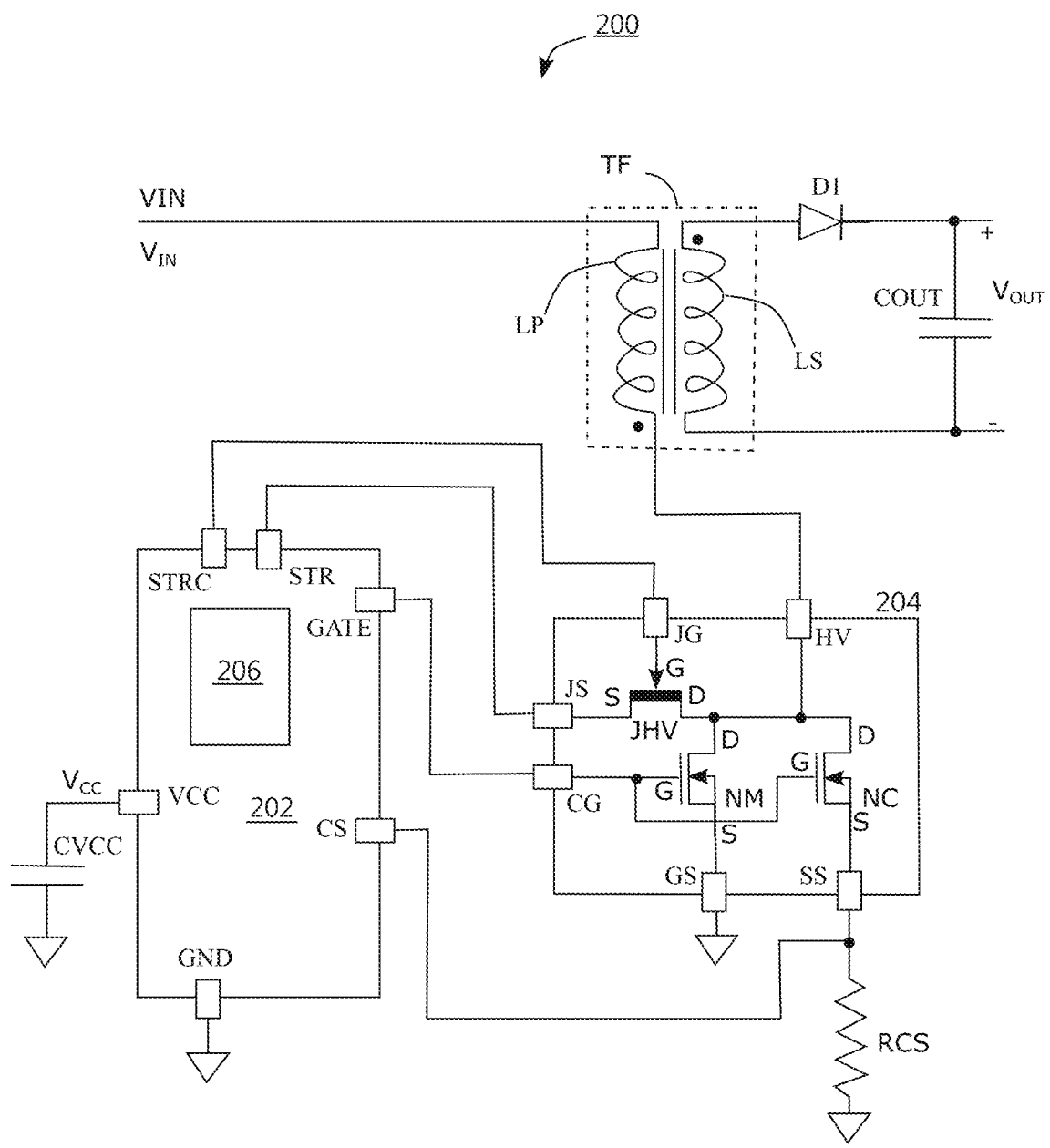
FIG. 2 demonstrates power supply 200 according to embodiments of the invention.

FIG. 2 demonstrates power supply 200 according to embodiments of the invention. Power supply 200 has a flyback topology, but this invention is not limited to however. A power supply according embodiments of the invention could be an LLC power converter or a booster for example.

Power supply 200 converts input power source $V_{IN}$ at the primary side into output power source $V_{OUT}$ at the secondary side. Power supply 200 includes pulse-width-modulation controller 202, high-voltage semiconductor apparatus 204, transformer TF, current-sense resistor RCS, rectifier diode D1, capacitors CVCC and COUT.

According to embodiments of the invention, main circuits of pulse-width-modulation controller 202 and high-voltage semiconductor apparatus 204 are formed on two monocrystal chips, respectively. After packaging, pulse-width-modulation controller 202 has, but is not limited to have, operating power pin VCC, startup current pin STR, startup control pin STRC, gate-driving pin GATE, current-sense pin CS, and ground pin GND. After packaging, high-voltage semiconductor apparatus 204 has, but is not limited to have, high-voltage pin HV, control gate pin CG, primary source pin GS, sample pin SS, charge pin JS and charge-control pin JG. In another embodiment of the invention, pulse-width-modulation controller 202 and high-voltage semiconductor apparatus 204 are mainly formed on two monocrystal chips respectively, but these two chips are packaged together to form a single packaged integrated circuit with pins.

High-voltage semiconductor apparatus 204 includes three high-voltage semiconductor transistors: enhancement-mode MOSFETs NC and NM, and depletion-mode JFET JHV. Drain nodes D of MOSFETs NC and NM, and JFET JHV all electrically connect via high-voltage pin HV, to one end of primary winding LP of transformer TF, while the other end of primary winding LP electrically connects to input power source $V_{IN}$. Gate nodes G of MOSFETs NC and NM electrically connect, via control-gate pin CG, to gate-driving pin GATE of pulse-width-modulation controller 202. Source node S of MOSFET NM electrically connects to a ground line via primary source pin GS. Source node S of MOSFET NC connects, via sample pin SS, to current-sense resistor RCS and current-sense pin CS of pulse-width-modulation controller 202, while current-sense resistor RCS has an end connected to the ground line. Gate node G of JFET JHV electrically connects, via charge-control pin JG, to startup control pin STRC of pulse-width-modulation controller 202. Source node S of JFET JHV electrically connects, via charge pin JS, to startup current pin STR of pulse-width-modulation controller 202.

MOSFET NM is capable of acting as a main power switch to control current through primary winding LP. MOSFET NC, seemingly connected in parallel with MOSFET NM, is a current-sampling switch. Pulse-width-modulation controller 202 provides PWM signal at gate-driving pin GATE to turn ON and OFF MOSFETs NC and NM, so as to energize or deenergize transformer TF. When transformer TF is deenergizing, current through rectifier diode D1 can charge capacitor COUT to build up output power source $V_{OUT}$. Pulse-width-modulation controller 202 detects the current through MOSFETs NC and NM, by monitoring the voltage signal at current-sense pin CS.

JFET JHV is a high-voltage startup switch for power supply 200, that drains current directly from input power source $V_{IN}$ to charge capacitor CVCC when operating power source $V_{CC}$ is not ready. Pulse-width-modulation controller 202 has startup controller 206, which turns ON or OFF JFET JHV via startup control pin STRC. When JFET JHV is turned ON, at least a portion of the current through inductor LP charges capacitor CVCC, via a route through startup current pin STR and operating power pin VCC, to build up operating power source $V_{CC}$. For instance, the default condition of JFET JHV is ON when power supply 200 stays isolated and receives no external power at all for a long time. Therefore, when input power source $V_{IN}$ just electrically connects to a wall outlet to receive current from a main grid, some current will go through inductor LP, high-voltage pin HV, JFET JHV, charge pin JS, startup current pin STR, and operating power pin VCC, to charge capacitor CVCC, so that the voltage of operating power source $V_{CC}$ gradually increases over time. At the moment when the voltage of operating power source $V_{CC}$ is ready, or exceeds a predetermined level, 10 volt for example, pulse-width-modulation controller 202 sends an appropriate signal to startup control pin STRC and charge-control pin JG to turn off JFET JHV, so as to stop high-voltage startup.

Figure 3:
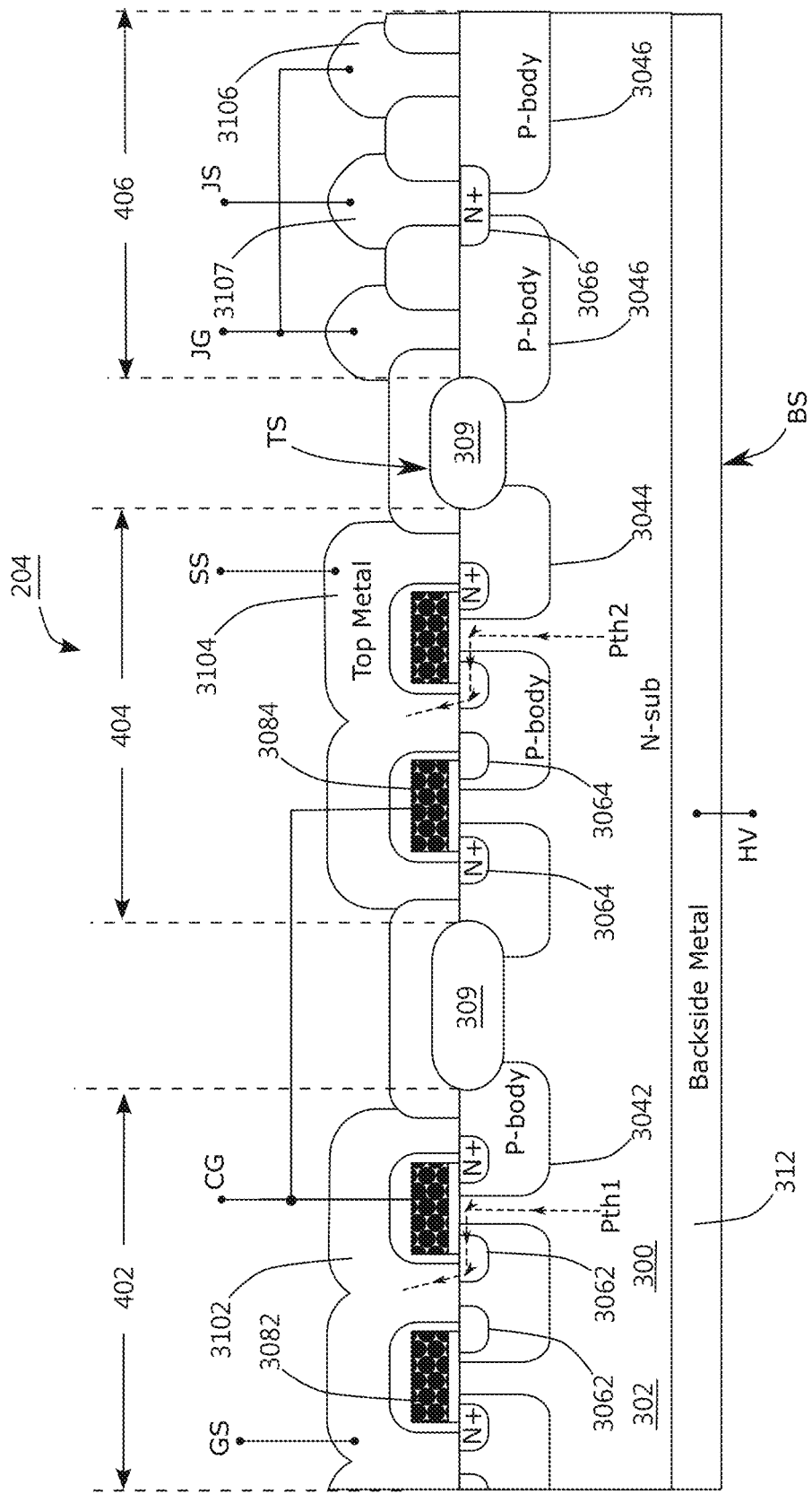
FIG. 3 illustrates a cross section of high-voltage semiconductor apparatus 204 in FIG. 2.

FIG. 3 illustrates a cross section of high-voltage semiconductor apparatus 204 in FIG. 2. The three high-voltage semiconductor transistors are integrated in a single monocrystal chip 300. Top surface TS of monocrystal chip 300 shown in FIG. 3 is divided by field oxide 309 to have active regions 402, 404 and 406, within which MOSFETs NM and NC, JFET JHV are formed respectively. Formed on monocrystal chip 300 are n-type substrate 302, p-type body regions 3042, 3044 and 3046, n-type heavily-doped regions 3062, 3064 and 3066. A p-type region refers to a region in which the majority carriers are holes each having a positive charge. In the opposite, a n-type region refers to a region in which the majority carriers are electrons each having a negative charge. Poly-silicon gate 3082 is formed above p-type body region 3042 and n-type heavily-doped region 3062 and partially overlaps with them. Similarly, poly-silicon gate 3084 is above p-type body region 3044 and n-type heavily-doped region 3064 and partially overlaps with them. Each poly-silicon gate has a gate oxide thereunder for electric isolation.

Enhancement-mode MOSFET NM, as demonstrated in FIG. 3, is a vertical double-diffused MOSFET, VDMOS, formed within active regions 402. Source node S, body node B, drain node D and gate node G of MOSFET NM could be represented by n-type heavily-doped doped region 3062, p-type body region 3042, n-type substrate 302 and polysilicon gate 3082 respectively. Metal layer 3102 provides electric connection among n-type heavily-doped regions 3062, p-type body regions 3042 and primary source pin GS. Similarly, enhancement-mode MOSFET NC is also a VDMOS formed within active regions 404, having source node S, body node B, drain node D and gate node G capable of being represented by n-type heavily-doped region 3064, p-type body region 3044, n-type substrate 302 and polysilicon gate 3084 respectively. Metal layer 3104 provides electric connection among n-type heavily-doped regions 3064, p-type body regions 3044 and sample pin SS. Poly-silicon gates 3082 and 3084 electrically connect to each other and to control-gate pin CG through interconnection shown in FIG. 3.

MOSFETs NM and NC are vertical devices because the direction that the current flows from a drain node to a source node inside each of them is substantially vertical to top surface TS of monocrystal chip 300.

Back-side metal layer 312 formed on backside surface BS of monocrystal chip 300 acts as an electric contact for n-type substrate 302, and electrically connects to high-voltage pin HV.

When the voltage at control-gate pin CG is high enough, conductive channels form on the surfaces of p-type body regions 3042 and 3046 under polysilicon gates 3082 and 3084, meaning MOSFETs NM and NC are ON. These conductive channels, parallel to top surface TS of monocrystal chip 300, electrically connect n-type substrate 302 to n-type heavily-doped regions 3062 and 3064, respectively. Current paths Pth1 and Pth2 demonstrate the major paths that electric current flows inside MOSFETs NM and NC when MOSFETs NM and NC are turned ON.

JFET JHV has source node S, control node G and drain node D represented by n-type heavily-doped region 3066, p-type body regions 3046, and n-type substrate 302, respectively. Metal layer 3106 electrically connects p-type body regions 3046 to charge-control pin JG. Metal layer 3107 electrically connects n-type heavily-doped region 3066 to charge pin JS.

The voltage difference between the source node S and the control node G of JFET JHV determines whether the conductive channel clamped between two p-type body regions 3046 forms. The path for the current flowing within JFET JHV from n-type substrate 302, through the conductive channel, to n-type heavily-doped region 3066 is substantially vertical to top surface TS of monocrystal chip 300, so JFET JHV is a vertical device. The distance between two p-type body regions 3046 can determine the threshold voltage of JFET JHV. According to some embodiments of the invention, JFET JHV is a depletion-mode JFET, meaning the threshold voltage is negative, and according to some other embodiments it is an enhancement-mode JFET, meaning the threshold voltage is positive.

As shown in FIG. 3, monocrystal chip 300 has top surface TS and backside surface BS. The drain nodes of MOSFETs NC and NM and JFET JHV, all referring to the common n-type substrate 302 in FIG. 3, electrically connect to primary winding LP via back-side metal layer 312 on backside surface BS. The source node of MOSFET NM electrically connects to a ground line via metal layer 3102 on top surface TS.

Figure 4A:
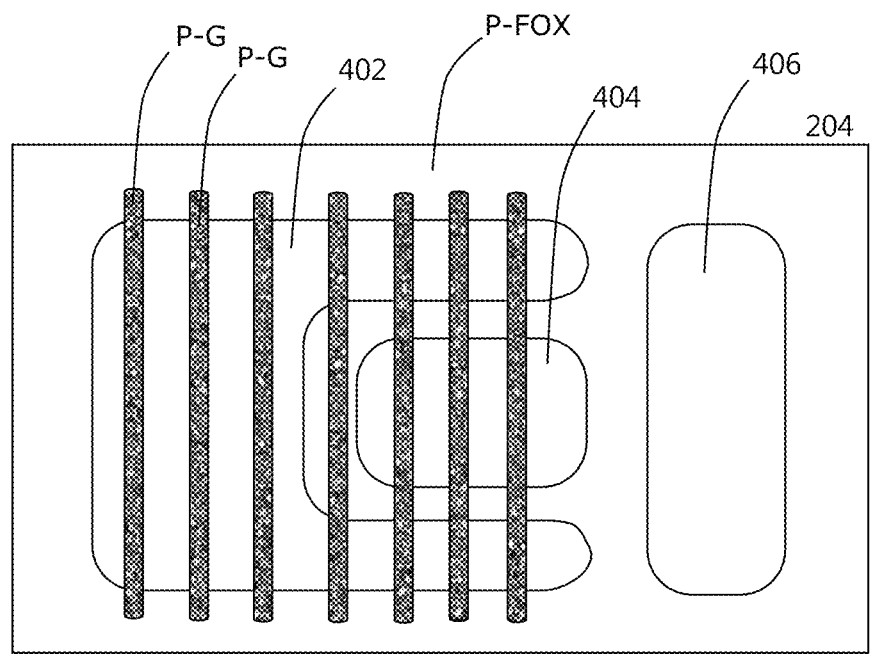
FIG. 4A demonstrates a top view of high-voltage semiconductor apparatus 204, showing field oxide pattern P-FOX and gate pattern P-G.

FIG. 4A demonstrates a top view of high-voltage semiconductor apparatus 204, showing field oxide pattern P-FOX and gate pattern P-G. Field oxide pattern P-FOX defines distinct active regions 402, 404 and 406, within which enhancement-mode MOSFETs NM, NC and JFET JHV are respectively formed. Gate pattern P-G has several strips across active regions 402 and 404, to define the locations of polysilicon gates 3082 and 3084 in FIG. 3.

Figure 4B:
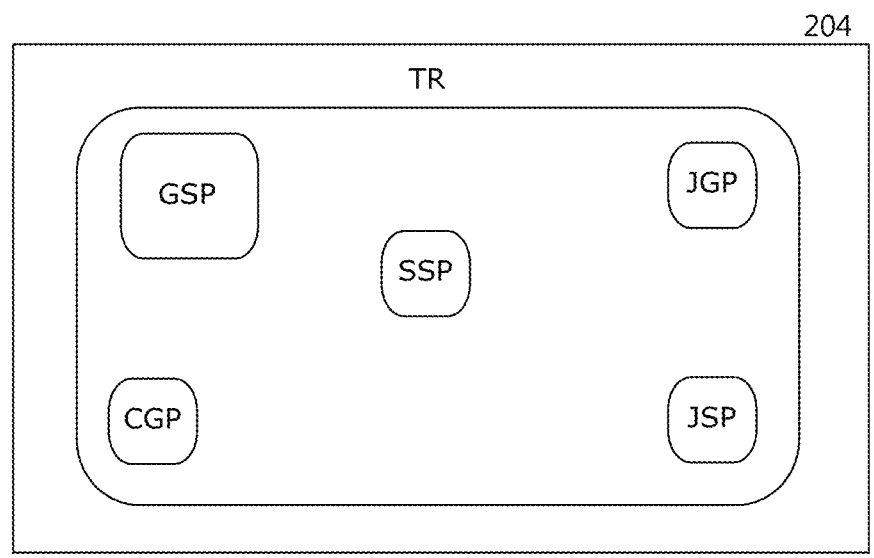
FIG. 4B demonstrates another top view of high-voltage semiconductor apparatus 204, showing control gate pad CGP, primary source pad GSP, sample pad SSP, charge-control pad JGP, and charge pad JSP.

FIG. 4B demonstrates another top view of high-voltage semiconductor apparatus 204, showing control gate pad CGP, primary source pad GSP, sample pad SSP, charge-control pad JGP, and charge pad JSP, and each of the pads can sustain a bonding wire, for example, to electrically connect to a pin. Polysilicon gates 3082 and 3084 in FIG. 3 electrically connect to control gate pad CGP in FIG. 4B via interconnection like metal layers and/or contact plugs on top surface TS of monocrystal chip 300. Similarly, n-type heavily-doped region 3062 and p-type body region 3042 electrically connect to primary source pad GSP via metal layer 3102; n-type heavily-doped region 3064 and p-type body region 3044 to sample pad SSP via metal layer 3104; p-type body region 3046 to charge-control pad JGP via metal layer 3106; and n-type heavily-doped region 3066 to charge pad JSP via metal layer 3107. Control-gate pin CG, primary source pin GS, sample pin SS, charge pin JS, and charge-control pin JG shown in FIG. 2 are electrically connected to corresponding pads in FIG. 4B formed on top surface. High-voltage pin HV is electrically connected to back-side metal layer 312 formed on backside surface BS.

FIG. 4B also shows termination ring TR, which surrounds active regions 402, 404 and 406, and acts as a scarification zone protecting transistors or devices in active regions from being damaged during chip singulation.

According to embodiments of the invention, a resistor made of polysilicon is formed inside termination ring TR and on field oxide pattern P-FOX, and it can be electrically connected between charge pad JSP and metal layer 3107 to constrain the current conducted by JFET JHV.

In comparison with power supply 100, power supply 200 in FIG. 2 is beneficial in the aspects below.

Power supply 200 has better power conversion efficiency. Only a portion of the current through primary winding LP goes through current-sense resistor RCS. Therefore, current-sense resistor RCS consumes relatively less power, making power supply 200 have better power conversion efficiency.

Pulse-width-modulation controller 202 in power supply 200 could be cheaper in view of manufacturing cost than pulse-width-modulation controller 102 in power supply 100. Pulse-width-modulation controller 102, if made in form of a monocrystal chip, needs an expensive manufacturing process specially for producing devices capable of sustaining hundreds of volts, because its high-voltage pin HV needs to face the direct high voltage stress from input power source, possibly as high as 260 volt. In comparison, the process for manufacturing pulse-width-modulation controller 202 on a single monocrystal chip only needs to produce devices sustaining tens of volts, so the cost of the process is expectedly cheaper.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor apparatus, comprising:
   a first transistor, a second transistor, a third transistor, a high-voltage pin, a control-gate pin, a primary source pin, a sample pin, a charge pin, and a charge-control pin;
   wherein both the first and second transistors are vertical devices, each having a source node, a gate node and a drain node, the source node of the first transistor electrically connected to the primary source pin, the source node of the second transistor electrically connected to the sample pin, and the gate nodes of the first and the second transistors electrically connected to the control-gate pin;
   the third transistor is a vertical JFET with a source node, a control node and a drain node, the source node of the third transistor electrically connected to the charge pin, and the control node of the third transistor electrically connected to the charge-control pin; and
   all of the drain nodes of the first, second and third transistors are electrically connected to the high-voltage pin.

2. The semiconductor apparatus as claimed in claim 1, wherein the first and second transistors are enhancement-mode MOSFETs, and the third transistor is a depletion-mode JFET.

3. The semiconductor apparatus as claimed in claim 1, wherein the first, second and third transistors are integrated on a monocrystal chip.

4. The semiconductor apparatus as claimed in claim 3, wherein the monocrystal chip has a top surface and a backside surface, the control-gate pin, the primary source pin, the sample pin, the charge pin, and the charge-control pin are electrically connected to corresponding pads formed on the top surface, and the high-voltage pin is electrically connected to a back-side metal layer formed on the backside surface.

5. A power supply, comprising:
   a semiconductor apparatus, comprising:
      first, second and third transistors, wherein both the first and second transistors are vertical devices, each having a source node, a gate node and a drain node, the third transistor is a vertical JFET with a source node, a control node and a drain node, and the source of the first transistor is electrically connected to a ground line;
   a pulse-width-modulation controller, comprising a startup current pin, a startup control pine, a gate-driving pin, and a current-sense pin, wherein the startup current pin is electrically connected to the source node of the third transistor, the startup control pin to the control node of the third transistor, the gate-driving pin to the gate nodes of the first and second transistors, and the current-sense pin to the source node of the second transistor;
   an inductor electrically connected to the drain nodes of the first, second and third transistors; and
   a current-sense resistor electrically connected between the source node of the second transistor and the ground line.

6. The power supply as claimed in claim 5, wherein the first and second transistors are enhancement-mode MOSFETs, and the third transistor is a depletion-mode JFET.

7. The power supply as claimed in claim 5, wherein the first, second and third transistors are integrated on a first monocrystal chip, and the pulse-width-modulation controller is formed on a second monocrystal chip.

8. The power supply as claimed in claim 7, wherein the first monocrystal chip has a top surface and a backside surface, the drain nodes of the first, second and third transistors are electrically connected to the inductor via the backside surface, and the source node of the first transistor is electrically connected to the ground line via the top surface.

9. A power supply, comprising:
- a first monocrystal chip integrated with first, second and third transistors, wherein each of first and second transistor is an enhancement-mode MOSFET with a drain node, a source node and a gate node, the third transistor is a JFET with a drain node, a source node and a control node, all the first, second and third transistors are vertical devices, and the source node of the first transistor connects to a ground line;
- an inductor electrically connected to the drain nodes of the first, second and third transistors;
- a current-sense resistor connected between the source of the second transistor and the ground line; and
- a second monocrystal chip electrically connected to the first monocrystal chip, for providing a PWM signal to the gate nodes of the first and second transistor, monitoring a voltage at the source node of the second transistor, and controlling via the control node the third transistor to conduct a current flowing through the inductor and the third transistor so as to build up an operating power source.

10. The power supply as claimed in claim 9, wherein the first monocrystal chip has a top surface and a backside surface, the source nodes, the gate nodes and the control node are represented by n-type doped regions, polysilicon gates and p-type region on the top surface respectively, and the drain nodes are represented by a n-type substrate and a metal layer on the backside surface.

11. The power supply as claimed in claim 9, wherein the third transistor is a vertical JFET.

* * * * *